(12) United States Patent
Kim et al.

(10) Patent No.: US 6,849,992 B2
(45) Date of Patent: *Feb. 1, 2005

(54) PLASMA DISPLAY DEVICE HAVING EFFICIENT HEAT CONDUCTIVITY

(75) Inventors: Ki-Jung Kim, Ashan (KR); Guy-Sung Kim, Suwon (KR); Ki-Yun Joung, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 30 days.

This patent is subject to a terminal disclaimer.

(21) Appl. No.: 10/293,348

(22) Filed: Nov. 13, 2002

(65) Prior Publication Data

US 2003/0102789 A1 Jun. 5, 2003

(30) Foreign Application Priority Data

Dec. 3, 2001 (KR) ......................................... 2001-75980

(51) Int. Cl.[7] .............................. H01J 7/24; H01J 61/52; H01J 17/49
(52) U.S. Cl. ........................... 313/46; 313/46; 313/582
(58) Field of Search .......................... 313/44–46, 581, 313/582; 362/294, 373

(56) References Cited

U.S. PATENT DOCUMENTS 5,971,566 A * 10/1999 Tani et al. .................. 362/294
6,700,315 B2 * 3/2004 Kim et al. .................... 313/46

FOREIGN PATENT DOCUMENTS

| JP | 10-172446 | 6/1998 |
| JP | 11-65485 | 3/1999 |
| KR | 1020000074192 | * 12/2000 |

* cited by examiner

Primary Examiner—Ashok Patel
(74) Attorney, Agent, or Firm—Christie, Parker and Hale, LLP

(57) ABSTRACT

The plasma display device including a plasma display panel, a chassis base disposed substantially parallel to the plasma display panel, and a thermally conductive medium which is disposed between the plasma display panel and the chassis base, and closely adhered to both the plasma display panel and the chassis base. The thermally conductive medium is formed out of gel-like adhesive materials.

4 Claims, 9 Drawing Sheets

Max. T : 58.5 °C
Min. T : 44.5 °C
ΔT = 14 °C

PLASMA DISPLAY DEVICE HAVING EFFICIENT HEAT CONDUCTIVITY

CROSS-REFERENCE TO RELATED APPLICATIONS

This application claims priority to and the benefit of Korean Application No. 2001-75980, filed on Dec. 3, 2001 in the Korean Patent Office, the entire disclosure of which is incorporated herein by reference.

FIELD OF THE INVENTION

The present invention relates to a plasma display device and, more particularly, to a plasma display device that has a heat conductive unit for dissipating to outside the plasma display device the heat generated at a plasma display panel.

BACKGROUND OF THE INVENTION

As is well known, a plasma display device realizes an image on a plasma display panel (PDP) by employing plasma generated from gas discharge. Hence, the PDP produces a considerable amount of heat because of the high-temperatures involved when performing gas discharge.

As a discharge rate of a plasma display device is increased to improve brightness, the heat generated at the PDP also increases. It is, therefore, essential to effectively dissipate the heat to outside the plasma display device to maintain good operation.

For that reason, a PDP in a conventional plasma display device is usually attached to a chassis base formed out of materials having a high degree of thermal conductivity, and a heat spreading sheet (or a thermally conductive sheet) is interposed between the PDP and the chassis base. As a result, the heat generated at the PDP can be dissipated to outside the plasma display device via the heat spreading sheet and the chassis base. The chassis base is typically formed by a die casting or press working process using a metallic material such as aluminum. The heat spreading sheet is typically formed of acryl or a silicone-based resin.

To improve the efficiency of the heat dissipation of the plasma display device as described above, it is important to effectively mount the heat spreading sheet. That is, the heat spreading sheet should be brought into substantially close contact with both the PDP and the chassis base in order to improve the heat dissipation efficiency.

Since the chassis base is produced by die casting, the surface thereof contacting the heat spreading sheet may not be formed sufficiently flat, and instead may be formed with a partially curved or raised portion. When the heat spreading sheet is attached to such an uneven surface of the chassis base, spaces are formed between the contact surfaces of the heat spreading sheet and that of the chassis base. Air fills these spaces to form an air gap.

If the plasma display device is manufactured with an air gap between the chassis base and the heat spreading sheet, an overall heat dissipation efficiency will be reduced because good heat conduction does not occur through the air gap. Such a problem may also occur at portions where the PDP and the heat spreading sheet contact.

To resolve the above problems, Japanese Patent Publication Laid-Open No. 10-172446 discloses a plasma display device, in which the heat dissipation efficiency is improved by attaching a panel to a thermally conductive medium. The thermally conductive medium is formed by the process of providing a cushioning medium in a rectangularly annular shape at a chassis member, and injecting a liquid of a thermally conductive medium into a region surrounded by the cushioning medium, after which the liquid is cured.

In the process of manufacturing the plasma display device as described above, the thermally conductive medium lacks fluidity while being attached to the panel because the liquefied thermally conductive medium is cured and then attached to the panel. Hence, the adhesion rate is not much higher than that of the conventional heat spreading sheet.

Silicone tape is further required for a cushioning medium, and double-sided tape is also required in order to attach the panel to the chassis member. The process of manufacturing the plasma display device according to the above-described method, therefore, involves high costs.

SUMMARY OF THE INVENTION

In accordance with the present invention, a plasma display device is provided that can improve the adhesion rate of a thermally conductive medium even in the case where a contact surface of the thermally conductive medium is not substantially flat.

Furthermore, the plasma display device in accordance with the present invention improves thermal conduction efficiency by improving the adhesion rate of the thermally conductive medium without having to increase the pressure applied against the thermally conductive medium.

Also, in the plasma display device in accordance with the present invention, a panel may be attached to a chassis base using gel-like adhesive materials without employing any additional adhesive means.

The plasma display device includes a plasma display panel, a chassis base disposed substantially parallel to the plasma display panel, and a thermally conductive medium which is disposed between the plasma display panel and the chassis base, and closely adhered to both the plasma display panel and the chassis base. The thermally conductive medium is formed out of gel-like adhesive materials, which may include a mixture of silicone and a hardener.

In addition, the thermally conductive medium includes a plurality of protrusions and a plurality of depressions formed on at least one side opposing a contacting surface of the plasma display panel or the chassis base. One of the recesses is formed between each pair of adjacent protrusions. The recesses provide paths for air to be expelled to outside the plasma display device while the thermally conductive medium is brought into contact with the contacting surface of the plasma display panel or the chassis base.

It is preferable that the protrusions are formed along the direction of one side of the thermally conductive medium in a striped pattern.

As described above, the plasma display device according to the present invention employs the gel-like adhesive materials as the thermally conductive medium, which is interposed between the plasma display panel and the chassis base closely contacting these two elements, thereby enhancing the adhesion rate of the panel, the thermally conductive medium, and the chassis base, resulting in a high efficiency of dissipating heat generated at the panel.

A process of manufacturing a plasma display device includes: providing a gel-like thermally conductive medium to a contacting surface of a chassis base; forming a plurality of protrusions and recesses by shaping the gel-like thermally conductive medium; bringing a plasma display panel into close contact with the thermally conductive medium, and pressing the plasma display panel; and curing the gel-like thermally conductive medium.

The step of providing the thermally conductive medium may include mixing silicone with a hardener in a predetermined ratio, and the step of curing the gel-like thermally conductive medium may include fastening the plasma display panel to the chassis base with a clip and leaving the assembly of the plasma display panel and the chassis base in this state for a predetermined time.

The step of forming a plurality of protrusions and recesses includes moving a surface former over the gel-like thermally conductive medium, in which the surface former has a plurality of blades. Alternatively, the step of forming a plurality of protrusions and recesses includes impressing the gel-like thermally conductive medium with a mold, in which the shape of the mold corresponds to the shape of protrusions and recesses.

The gel-like thermally conductive medium is shaped into the protrusions and recesses, and the panel is pressed against and adhered closely to the thermally conductive medium before the medium is cured as in above-described processes, thereby enhancing the adhesive efficiency by easily expelling the air existing between the panel and the thermally conductive medium. Furthermore, the thermally conductive medium also has adhesiveness, so that the plasma display device does not require any additional means for adhesion.

DETAILED DESCRIPTION OF THE INVENTION

Figure 1:
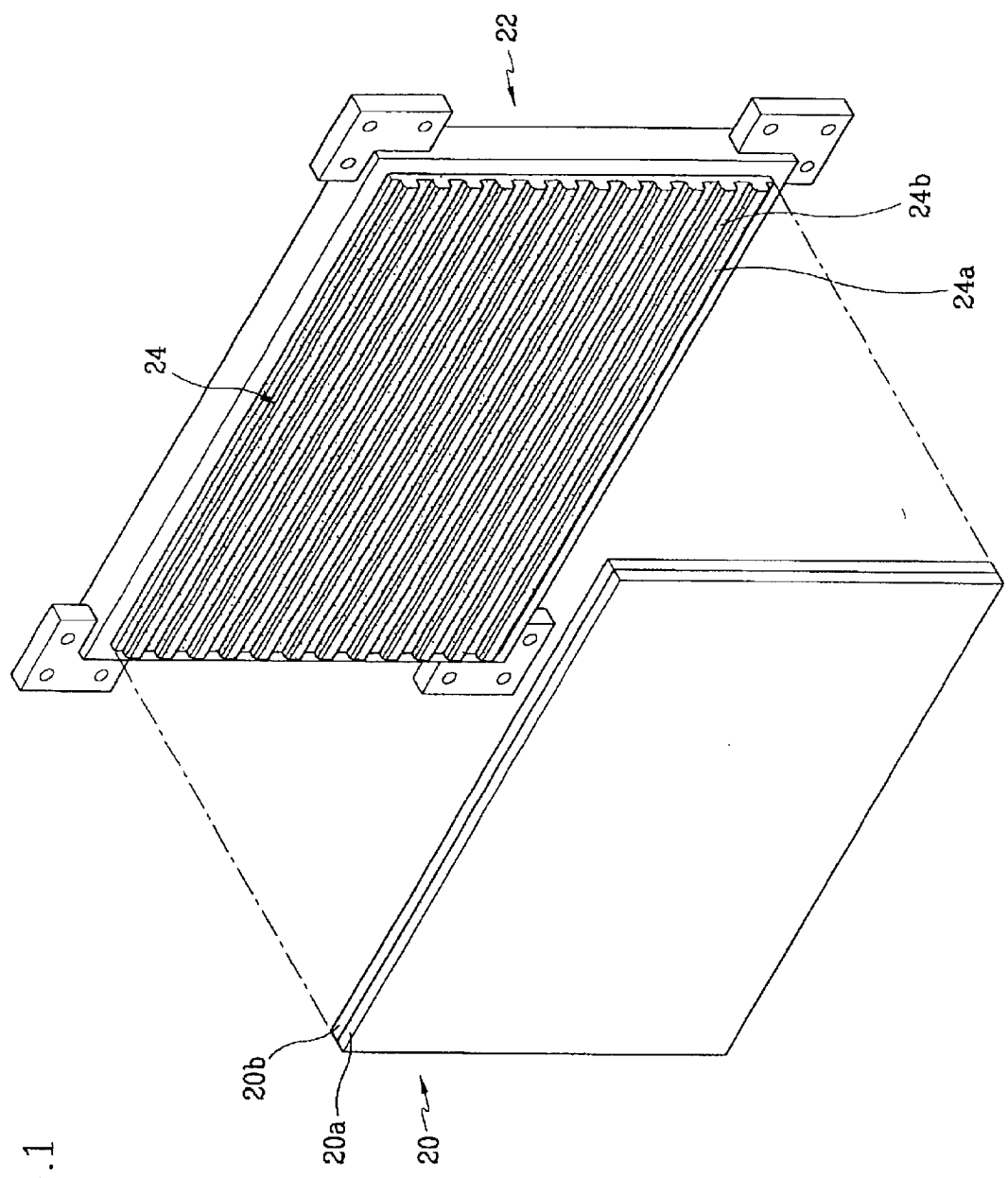
FIG. 1 is an exploded perspective view of a plasma display device having a thermally conductive medium according to an embodiment of the present invention.
Figure 2:
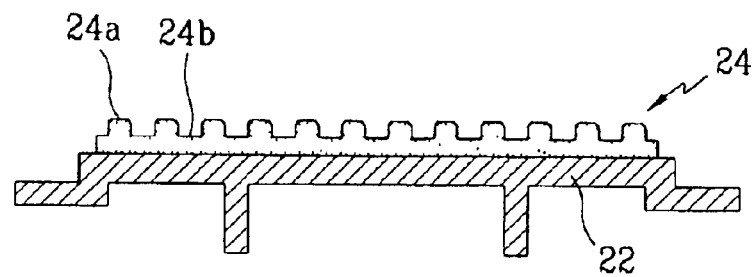
FIG. 2 is a sectional view showing a chassis base of the plasma display device, on which a thermally conductive medium is provided, according to a first embodiment of the present invention.
Figure 3:
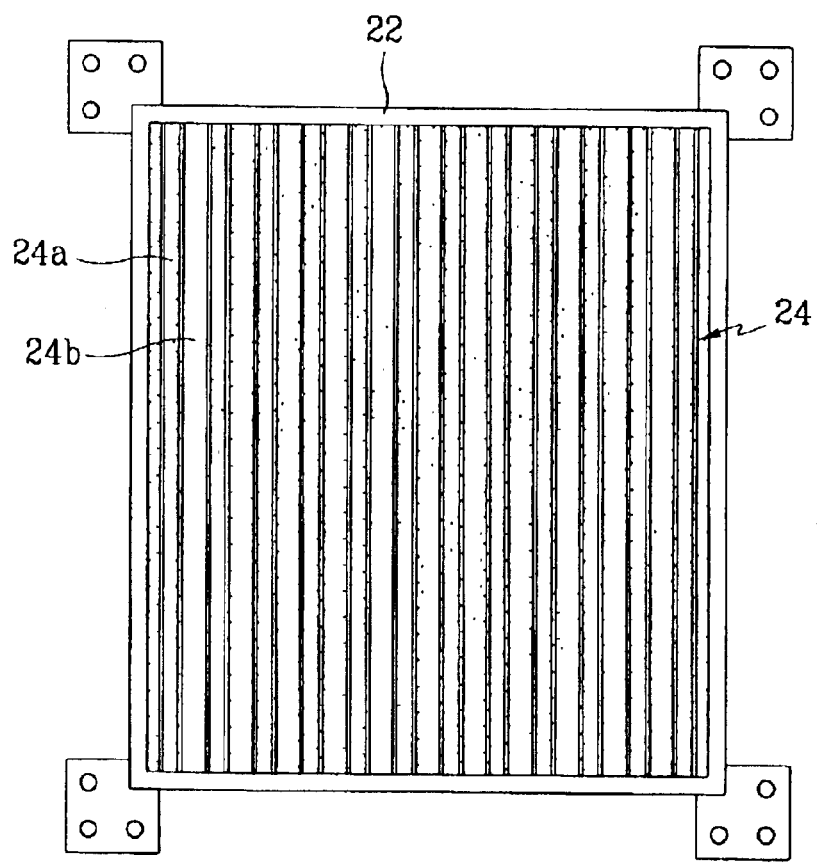
FIG. 3 is a top plan view showing a chassis base of the plasma display device, on which a thermally conductive medium is provided, according to a first embodiment of the present invention.

FIG. 1 is an exploded perspective view of a plasma display device having a thermally conductive medium according to an embodiment of the present invention, FIG. 2 is a sectional view showing a chassis base of the plasma display device, on which a thermally conductive medium is provided, according to a first embodiment of the present invention, and FIG. 3 is a top plan view of FIG. 2.

As shown in FIGS. 1 through 3, the plasma display device includes PDP 20 composed of two glass substrates 20a and 20b to realize an image through plasma from discharged gas, chassis base 22 disposed fixedly on a rear side of PDP 20 opposite the screen side thereof, and thermally conductive medium 24 interposed between PDP 20 and chassis base 22 to transfer heat generated at PDP 20 to chassis base 22 and dissipate the heat. A front case (not shown) is provided to the side of PDP 20, and a rear case (not shown) is provided to the side of chassis base 22, thereby completing the structure of the plasma display device.

In the above structure, PDP 20 has a rectangular shape with long sides and short sides, and chassis base 22 is formed from a material such as aluminum, which has a high degree of thermally conductivity. A driving circuit (not shown) is provided on the rear side of chassis base 22, opposite the side facing the PDP, for driving the plasma display device.

Thermally conductive medium 24, together with chassis base 22, act to dissipate the heat generated at PDP 20 due to the operation of the plasma display device to outside the plasma display device. In order to enhance the efficiency in the adhesion of thermally conductive medium 24 to chassis base 22 or PDP 20, thermally conductive medium 24 has a structure with the following features.

Thermally conductive medium 24 is formed out of a gel-like material, which has adhesiveness. The gel-like adhesive material used for thermally conductive medium 24 can be realized by mixing liquid silicone and a hardener at a predetermined ratio, such as in a 1 to 1 ratio.

Thermally conductive medium 24 can be, therefore, adhered to PDP 20 or chassis base 22 at an enhanced adhesion rate while applying a light pressure, even though the contacting surface of PDP 20 or chassis base 22 is not flat and has small protrusions on the surface. Furthermore, PDP 20 can also be adhered stably to chassis base 22 without an additional means for adhesion such as double-sided tape.

When the gel-like adhesive material used for thermally conductive medium 24 is applied to the contacting surface of chassis base 22 and PDP 20 is attached thereto, the surface of the gel-like adhesive material must be shaped into the protrusions and recesses as shown in FIGS. 2 and 3, to improve the adhesion rate.

Thermally conductive medium 24 is shaped to include a plurality of protrusions 24a and a plurality of recesses 24b, formed on the face opposing a surface of plasma display panel 20 that thermally conductive medium 24 contacts. One of the recesses 24b is formed between each pair of adjacent protrusions 24a, recesses 24b providing paths for air to be expelled to the outside of the plasma display panel in a state where thermally conductive medium 24 is brought into contact with the contacting surface of PDP 20.

It is preferable that protrusions 24a are formed parallel to long sides of chassis base 22 in a striped pattern, and recesses 24b are formed in an alternating fashion with protrusions 24a.

Accordingly, the air existing between PDP 20 and thermally conductive medium 24 can be expelled easily through recesses 24b such that the adhesion rate and the heat dissipation efficiency can be improved by preventing an unnecessary air gap from being formed.

It is also preferable to take into consideration the curvature and flatness of PDP 20 and chassis base 22, as well as the heat dissipation efficiency when the thickness of thermally conductive medium 24 is determined.

Hereinafter, a process for manufacturing a plasma display device according to an embodiment of the present invention will be described.

FIGS. 4A through 4F are sectional views for illustrating a process of manufacturing a plasma display device according to an embodiment of the present invention.

Figure 4A:
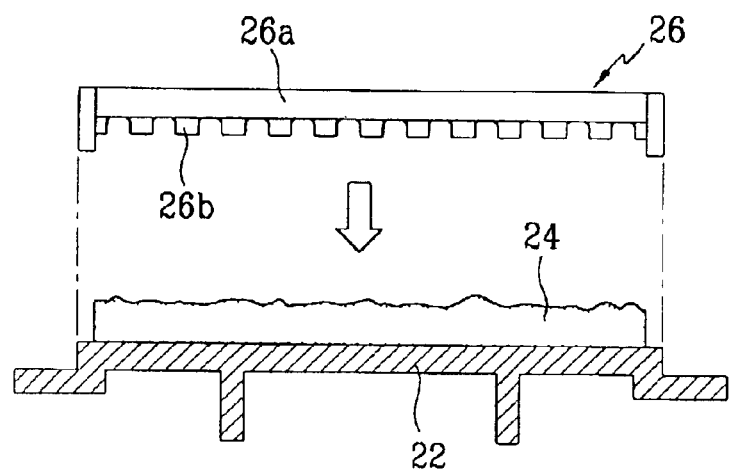
FIGS. 4A through 4F are sectional views for illustrating a process of manufacturing a plasma display device according to an embodiment of the present invention.

As shown in FIG. 4A, gel-like thermally conductive medium 24 is applied to a contacting surface of chassis base 22.

It is preferable that gel-like thermally conductive medium 24 is applied uniformly to the contacting surface of chassis base 22 in a predetermined thickness. The thickness in which gel-like thermally conductive medium 24 is applied should be determined in consideration of the final, desired thickness of thermally conductive medium 24. For example, the final desired thickness of the thermally conductive medium may be within the range of 1 mm through 1.5 mm.

Silicone and a hardener may be mixed at a predetermined ratio, and applied to the contacting surface of chassis base 22 as thermally conductive medium 24.

After being applied to the contacting surface of chassis base 22, gel-like thermally conductive medium 24 is shaped into a form having the protrusions 24a and recesses 24b.

Surface former 26 as shown in FIG. 4A is used for shaping thermally conductive medium 24. Surface former 26 includes strip member 26a having substantially the same width as a short side of chassis base 22, and a plurality of blades 26b provided on a lower end of strip member 26a in the shape corresponding to a cross-section of recesses 26b.

Figure 4B:
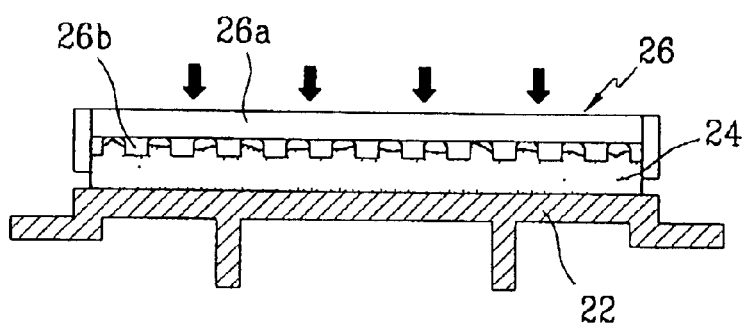
Figure 4C:
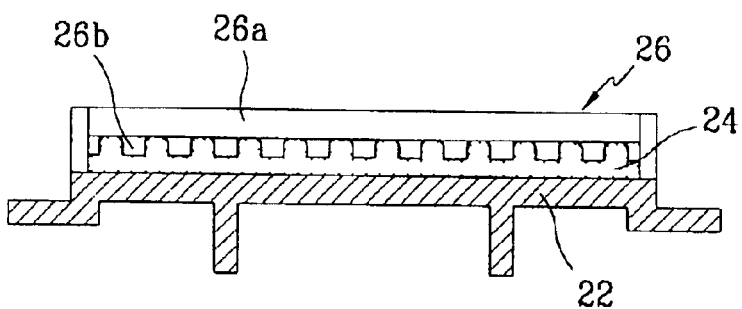

Blades 26b of surface former 26, as shown in FIGS. 4b and 4c, are brought into close contact with thermally conductive medium 24, and moved along the direction parallel with a long side of chassis base 22, resulting in the formation of recesses 24b and protrusions 24a.

The cross-section of blades 26b may be arc-shaped, or may be a polygonal such as in the shape of a triangle, a quadrangle, and a pentagon. Moreover, the blade shape of surface former 26 may also vary with the cross-section of recesses 26b.

Alternatively, protrusions 26a and recesses 26b may be shaped by being impressed with a mold instead of surface former 26, in which the shape of the mold corresponds to the shape of protrusions 24a and recesses 24b.

Figure 5:
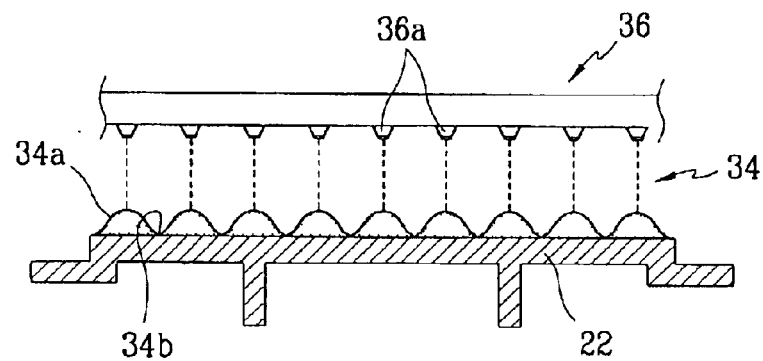
FIG. 5 is a sectional view showing a chassis base of the plasma display device, on which a thermally conductive medium is provided, according to a second embodiment of the present invention.

With reference to FIG. 5 showing a second embodiment of the present invention, protrusions 34a of thermally conductive medium 34 may be formed only on areas of chassis base 22 such that protrusions 34a are parallel with each other at regular intervals. This can be accomplished by employing dispenser 36 that is provided with a plurality of nozzles 36a at a predetermined interval. When gel-like thermally conductive medium 34 is supplied on chassis base 22 by nozzles 36a, the protrusions 34a of thermally conductive medium 34 are formed only at the portions corresponding to nozzles 36a, while the other portions where gel-like thermally conductive medium 34 is not provided result in the formation of recesses 34b.

Figure 4D:
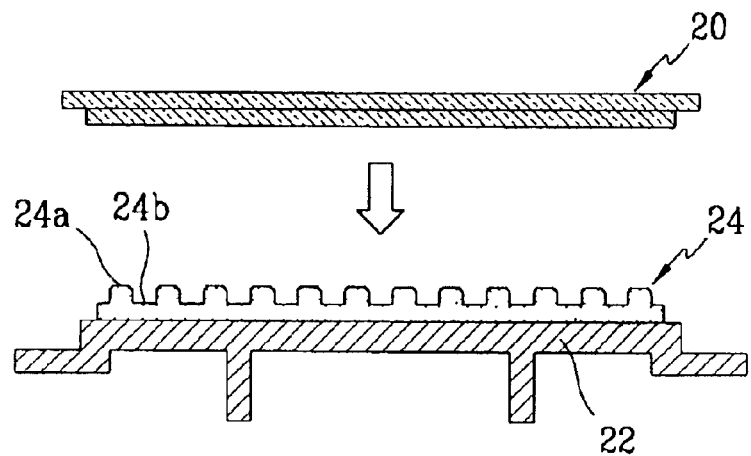
Figure 4E:
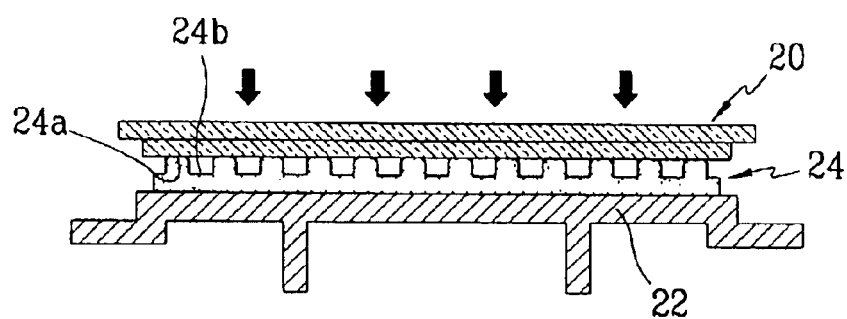

Referring back to FIG. 4, that is, FIGS. 4d and 4e, PDP 20 is next brought into close contact with thermally conductive medium 24, and compressed.

When being brought into contact with thermally conductive medium 24, PDP 20 comes into contact with protrusions 24a first, and portions of gel-like thermally conductive medium 24 that form protrusions 24a spread over recesses 24b, then fill up recesses 24b. During the above process, the air inside recesses 24b is expelled to the outside of these elements, and, as shown in FIG. 4f the entire surface of PDP 20 can be brought into close contact with thermally conductive medium 24.

Gel-like thermally conductive medium 24 is cured after the above process.

Figure 4F:
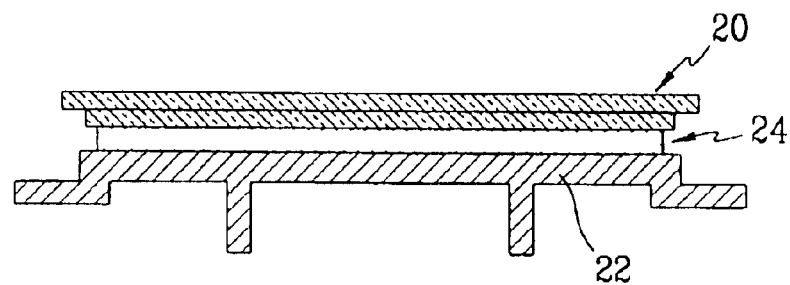

In order to cure gel-like thermally conductive medium 24, PDP 20 brought into contact with thermally conductive medium 24 may be left in the state shown in FIG. 4f for a predetermined time. Furthermore, since thermally conductive medium 24 has adhesiveness, it is possible to directly conduct a PDP module assembling operation by standing chassis base 22 with PDP 20 on its edge. Therefore, thermally conductive medium 24 can be left to cure naturally while performing other assembly operations in the module assembly line.

If necessary, chassis base 22 with PDP 20 may be left in the state shown in FIG. 4f for a predetermined time after chassis base 22 and PDP 20 are secured together by a clip.

Since gel-like thermally conductive medium 24 has adhesiveness, the state of adhesion can be fully maintained without any further means for adhesion such as a double-sided tape. Also, thermally conductive medium 24 also has a shock absorbing property after cured.

In the above-described embodiment of the present invention, it has been described that a gel-like thermally conductive medium is applied first to a chassis base and a PDP is brought into contact with the gel-like thermally conductive medium. However, the present invention is not limited in this respect, and it is possible to first apply a gel-like thermally conductive medium to a PDP, then bring a chassis base into contact with the gel-like thermally conductive medium.

In order to improve the adhesion rate of a thermally conductive medium according to an embodiment of the present invention, Gap Filler™ produced by Bergquist was employed as gel-like thermally conductive medium 24 and tested.

First, Gap Filler™ was applied to a chassis base and protrusions and recesses were formed by a surface former. Then, a transparent glass (rather than an actual PDP) was brought into close contact with Gap Filler™ so as to observe the areas of adhesion.

The thickness of Gap Filler™ applied as a thermally conductive medium was about 1.3 mm including the height of the protrusions, then was reduced to and maintained at about 1 mm after compressing the transparent glass.

After the gel-like thermally conductive medium was cured for a period of about thirty minutes after being compressed, the adhesion rate reached more than 90% and the state of adhesion was uniform even though the pressure applied to the transparent glass was less than that used in the prior art. Since the thermally conductive medium had adhesiveness and gel-like properties, it did not spill over or otherwise flow to undesired areas while being applied to the chassis base. As a result, a frame or any other such additional device was not required.

The case where an air gap existed between a chassis base and a panel (comparative example 1), the case where double-sided tape was interposed between a chassis base and a panel (comparative example 2), and the case where a heat-spreading sheet was interposed between a chassis base and a panel (comparative example 3) were compared with an embodiment of the present invention with regard to the heat dissipation efficiency.

The conditions applied to the above test are as shown in Table 1.

TABLE 1

| Section | Conditions |
| --- | --- |
| Model | 42" d1.1' |
| Display image | Full White |
| Voltage | 220 V |
| Power consumption | 300 W |
| Ambient temperature | 25° C. |

The temperature of the panel was measured by a T-type thermocouple, and recorded by a Yokohama DR230 hybrid recorder.

Figure 6:
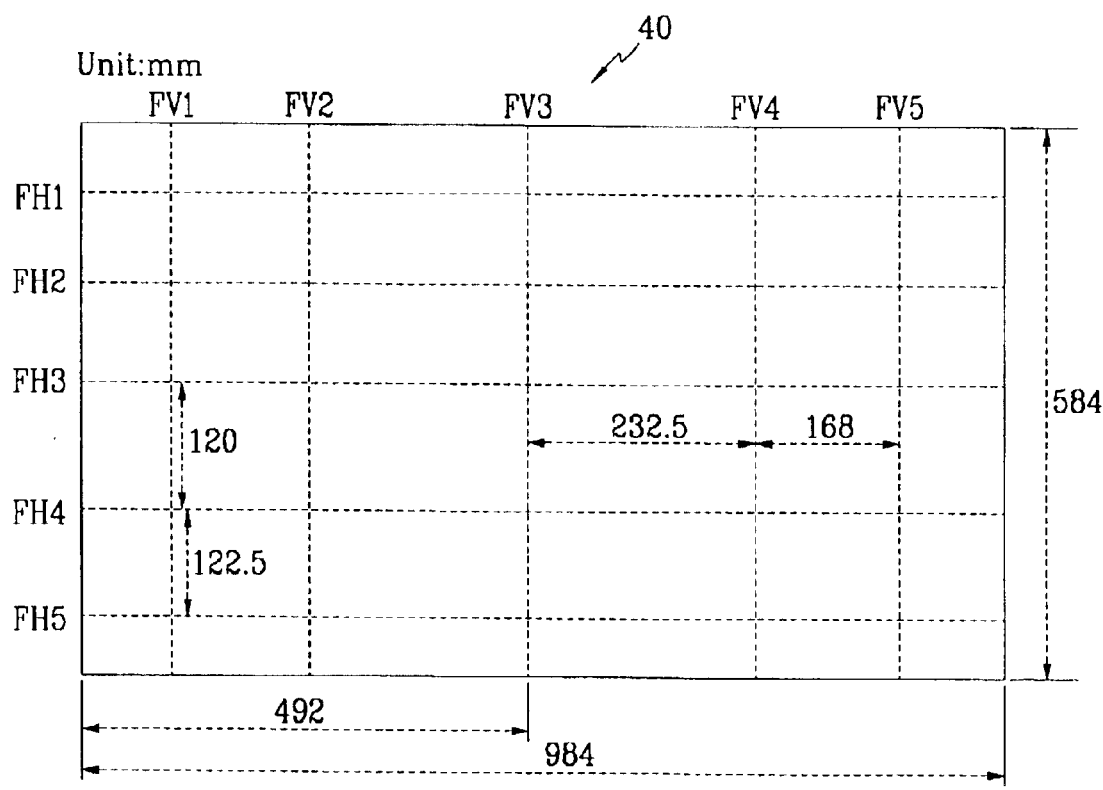
FIG. 6 is a schematic diagram representing temperature measuring points on a glass panel for estimating the heat dissipation efficiency of a thermally conductive medium according to an embodiment of the present invention.

FIG. 6 is a schematic diagram representing temperature measuring points on a glass panel for estimating the heat dissipation efficiency of a thermal conductive medium according to an embodiment of the present invention.

Temperatures were measured at twenty-five points at which five horizontal base lines (FH1~FH5) intersect five vertical base lines (FV1~FV5) on a glass panel 40. FIG. 6 indicates the locations of the points in detail.

The temperature distributions on the glass panel are represented in FIGS. 7A through 10B based on the measured temperatures of the embodiment of the present invention and the comparative examples. The maximum and minimum temperatures among the measured temperatures for each case were compared, the result of which are shown in Table 2.

TABLE 2

| Section | The present invention | Comparative example 1 | Comparative example 2 | Comparative example 3 |
| --- | --- | --- | --- | --- |
| Max. temperature ($T_{max}$, ° C.) | 52.8 | 59.8 | 57.0 | 58.5 |
| Min. temperature ($T_{min}$, ° C.) | 42.1 | 42.0 | 44.1 | 44.5 |
| Temperature difference ($\Delta T$, ° C.) | 10.7 | 17.8 | 12.9 | 14.0 |

The glass panel 40 was divided into three sections according to the temperature distributions on the glass panel 40:

I. High temperature section at which the temperature reached more than 51° C., II. Intermediate temperature section at which the temperature ranged from 47° C. to 51° C., III. Low temperature section at which the temperature was less than 47° C. FIGS. 7A, 8A, 9A, and 10A show schematic views of the divided sections according to the temperature distributions for each case, respectively. In the graphs of FIGS. 7B, 8B, 9B, and 10B, the abscissas represent the distance from the left side of the glass panel illustrated in FIG. 6 and the ordinates represent temperature.

Figure 7A:
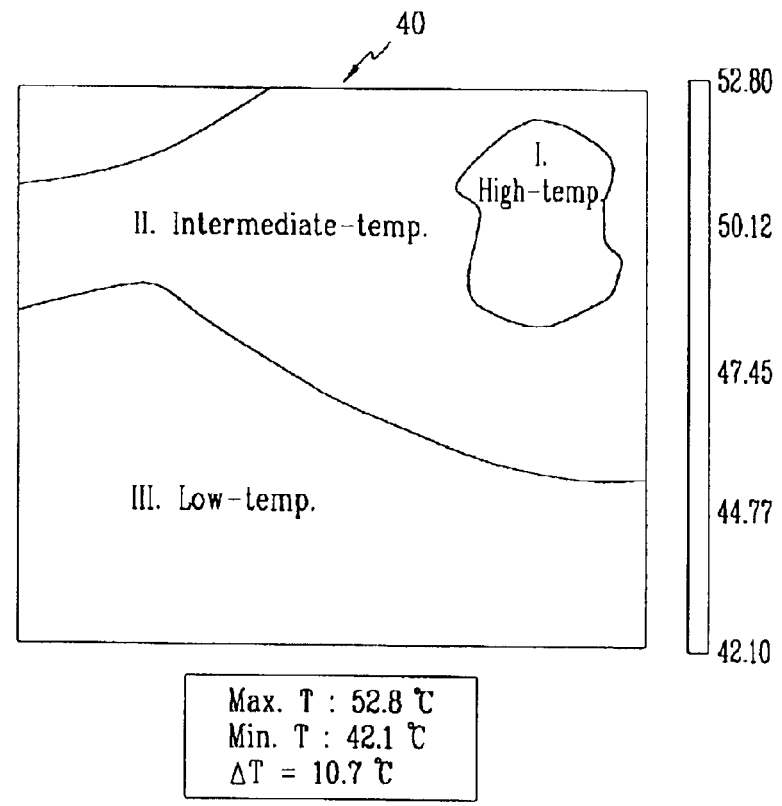
FIGS. 7A and 7B are graphs showing temperature distribution on a glass panel while employing a thermally conductive medium according to an embodiment of the present invention.
Figure 7B:
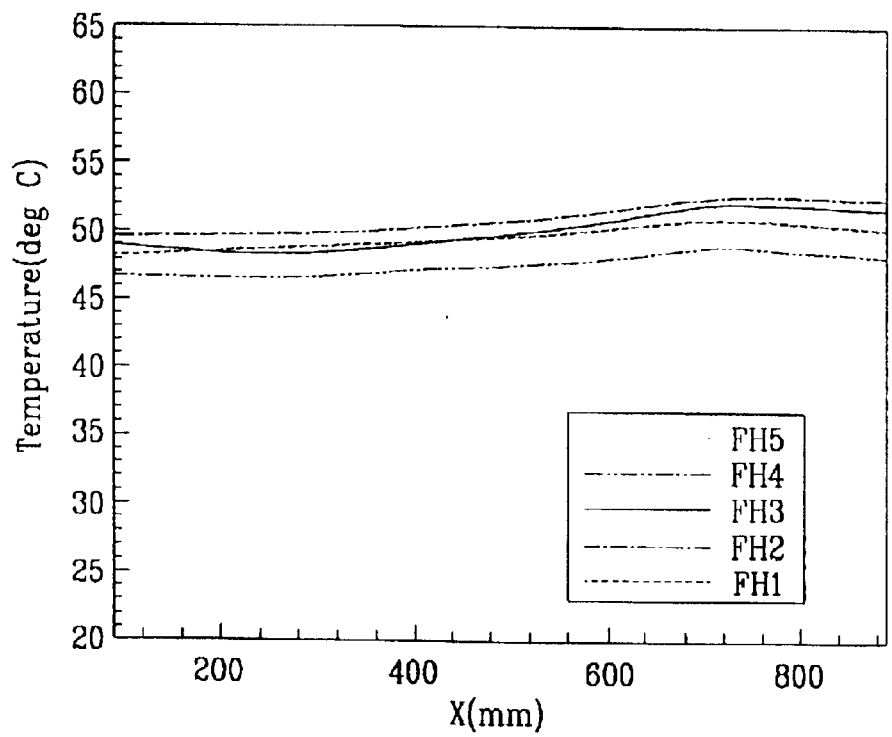

FIGS. 7A and 7B are graphs showing temperature distribution on a glass panel while employing a thermally conductive medium according to an embodiment of the present invention.

As shown in FIG. 7A, when the thermally conductive medium according to an embodiment of the present invention was employed, high temperature section I occupies a small portion of the glass panel 40, while low temperature section II occupies a large portion of the glass panel 40 at a lower part thereof.

As shown in FIG. 7B, the temperature along the line FH2 was generally the highest, with the maximum temperature ($T_{max}$) measuring 52.8° C. on FH2, while the minimum temperature ($T_{min}$) measured 42.1° C. on FH5. Thus, the temperature difference ($\Delta T$) came to 10.7° C. Accordingly, the temperature distribution was uniform on the whole, while the overall temperature of the glass panel 40 was lowered.

Figure 8A:
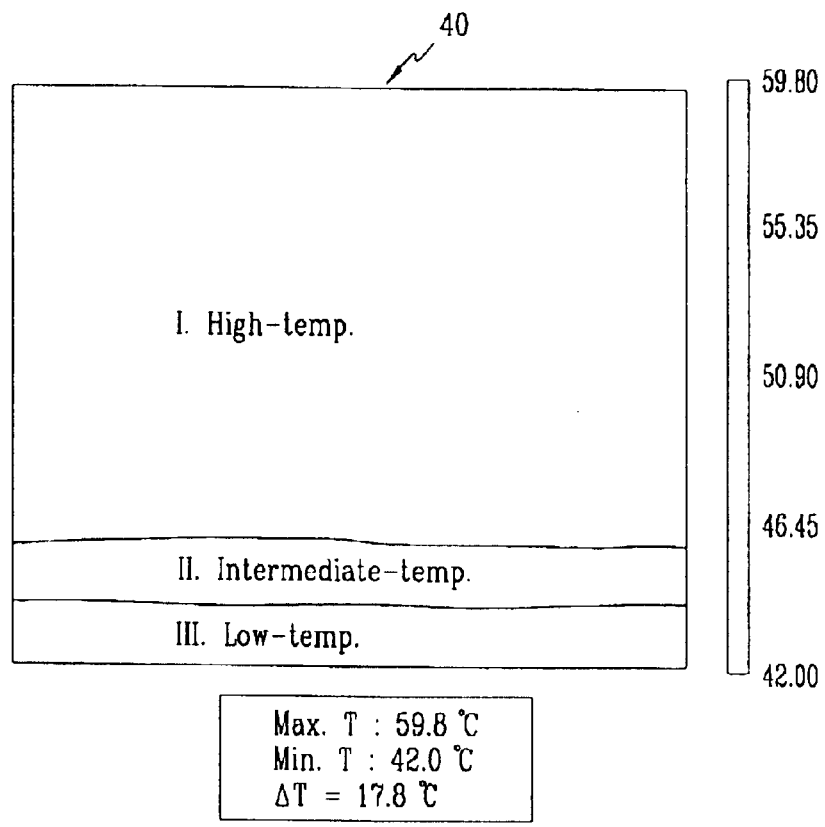
FIGS. 8A and 8B are graphs showing temperature distribution on a glass panel in the case where an air gap exists between a chassis base and a panel.
Figure 8B:
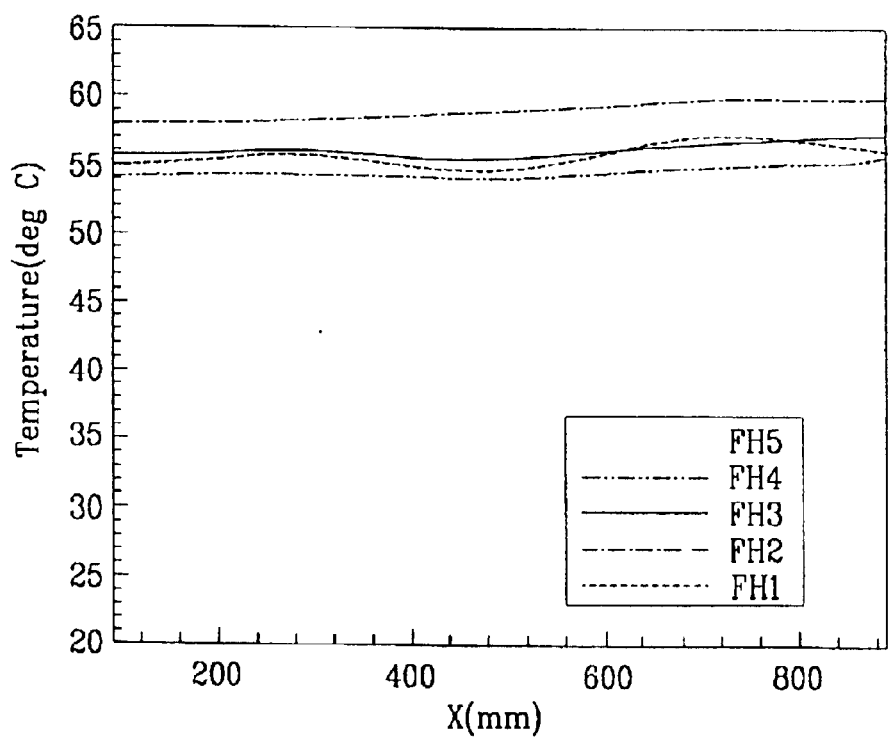

FIGS. 8A and 8B are graphs showing temperature distribution on a glass panel in the case where an air gap exists between a chassis base and a panel.

As shown in FIG. 8A, high temperature section I ranges over a majority of the glass panel 40, while intermediate and low temperature sections II and III occupy small portions at the lower part of the glass panel 40. Therefore, almost no heat is dissipated to the outside of the assembly.

As shown in FIG. 8B, the temperature along the line FH2 was generally the highest, with the maximum temperature ($T_{max}$) measuring 59.8° C. on FH2, while the minimum temperature ($T_{min}$) measured 42.0° C. on FH5. Thus, the temperature difference ($\Delta T$) came to 17.8° C. That is, the temperature goes up much from the lower part to the upper part, while the temperature changes little from left to right. This explains why the thermally conduction property worsens when an air gap is formed between a panel and a chassis base.

Figure 9A:
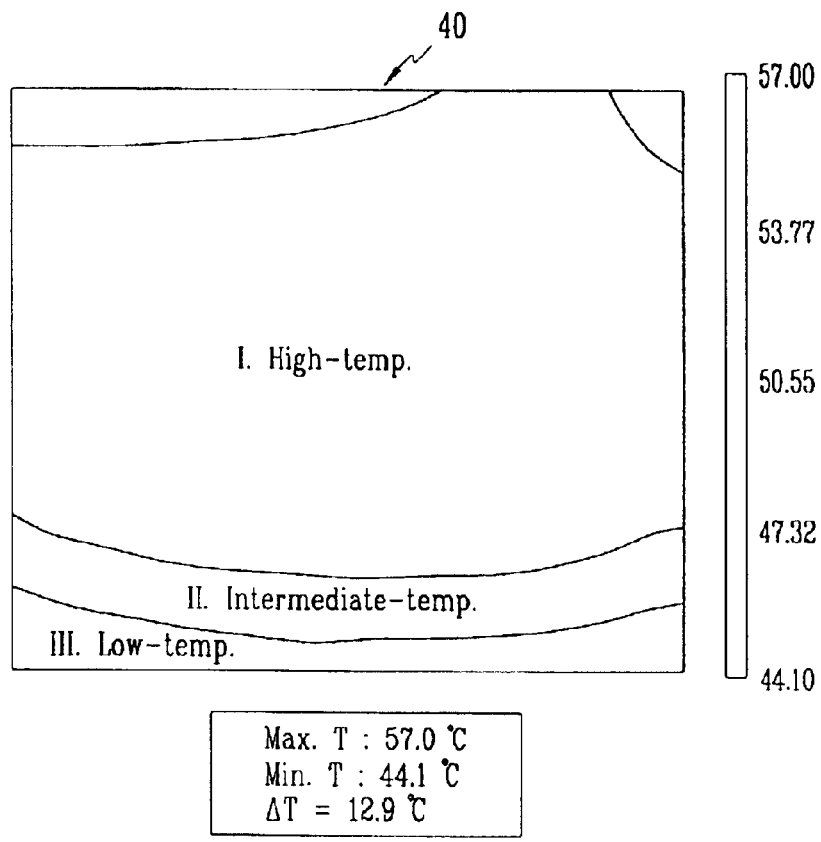
FIGS. 9A and 9B are graphs showing temperature distribution on a glass panel in the case where double-sided tape is provided between a chassis base and a panel.
Figure 9B:
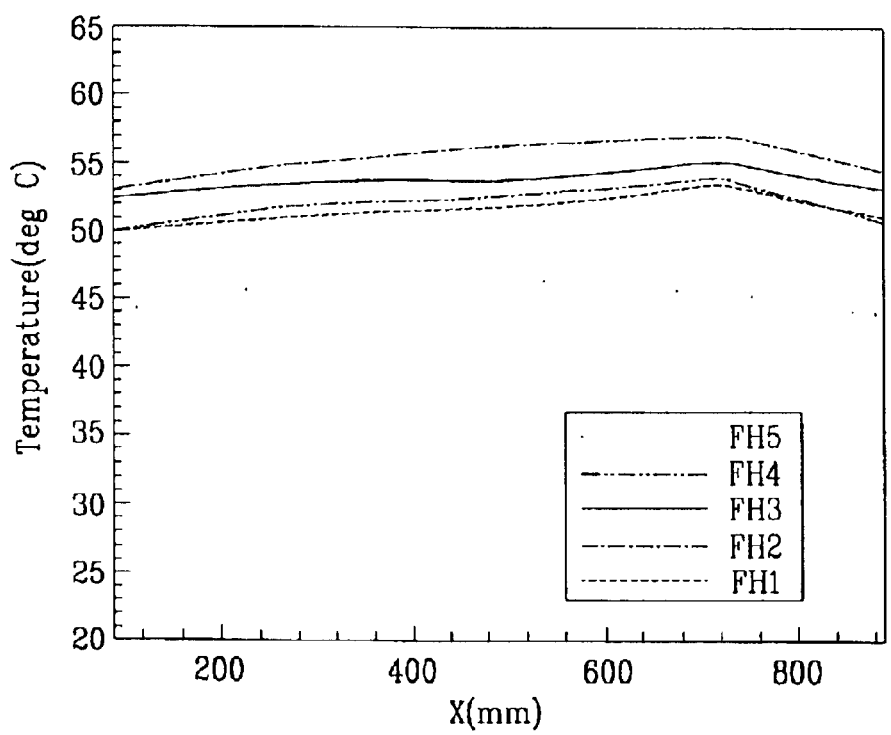

FIGS. 9A and 9B are graphs showing temperature distribution on a glass panel in the case where double-sided tape is provided between a chassis base and a panel.

As shown in FIG. 9A, high temperature section I ranges over a major portion of the glass panel 40, but intermediate and low temperature sections II and III occupy small portions at the upper and the lower parts of the glass panel 40.

As shown in FIG. 9B, the temperature along the line FH2 was generally the highest, with the maximum temperature ($T_{max}$) measuring 57.0° C. on FH2, while the minimum temperature ($T_{min}$) measured 44.1° C. on FH5. Thus, the temperature difference ($\Delta T$) came to 12.9° C. That is, the heat dissipation efficiency is better than the case where an air gap is formed, but worse than the present invention.

Figure 10A:
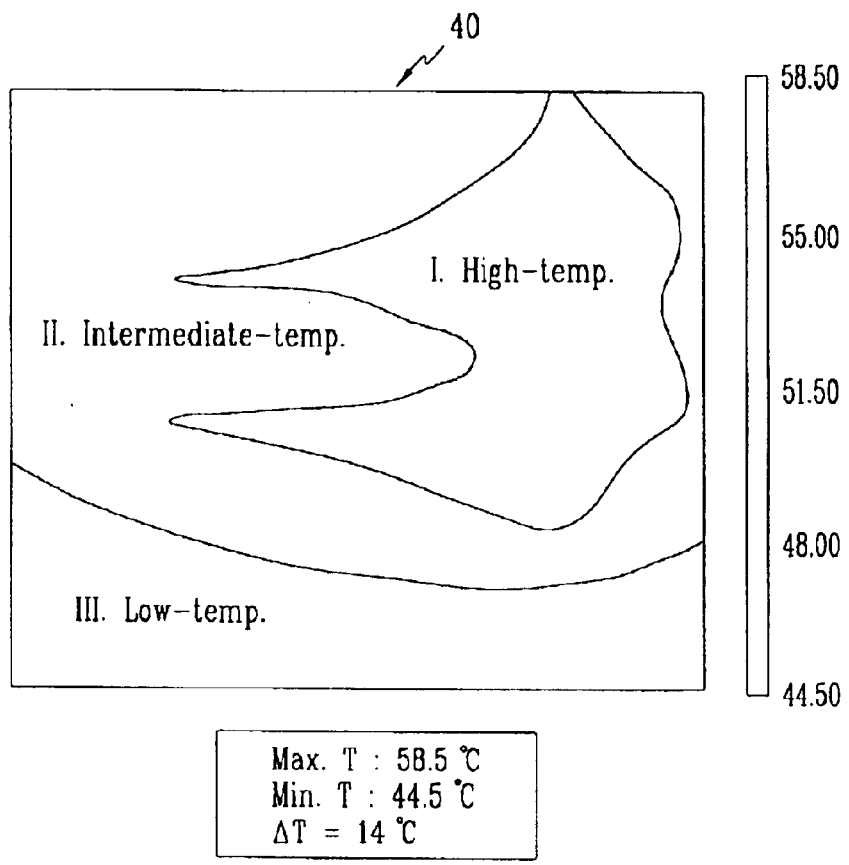
FIGS. 10A and 10b are graphs showing temperature distribution on a glass panel in the case where a heat spreading sheet is provided between a chassis base and a panel.
Figure 10B:
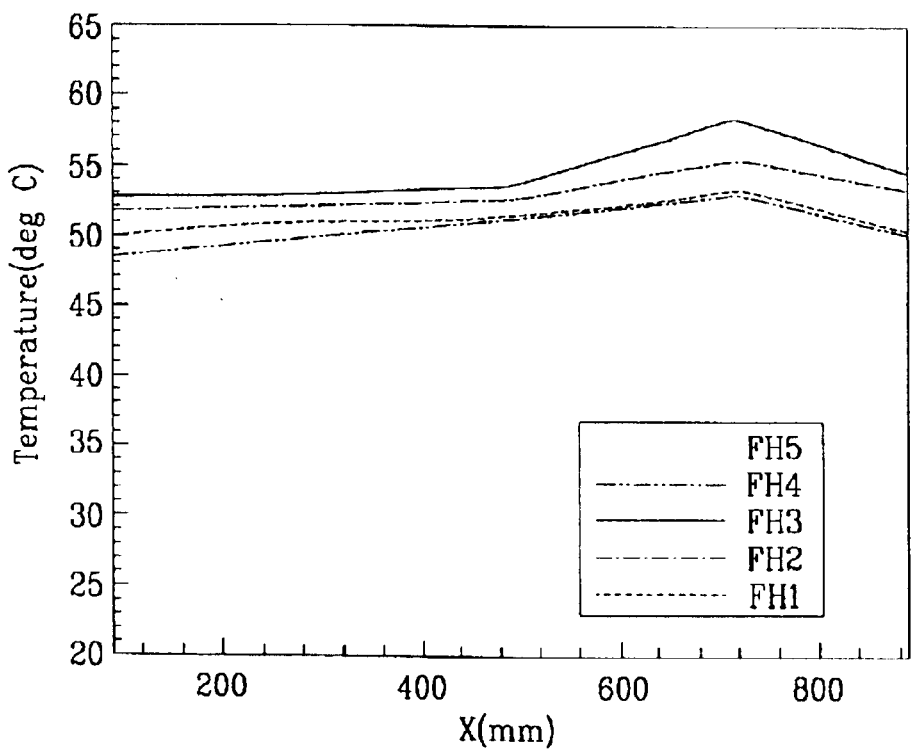

FIGS. 10A and 10b are graphs showing temperature distribution on a glass panel in the case where a heat spreading sheet is provided between a chassis base and a panel.

As shown in FIG. 10A, high temperature section I ranges from the right upper part to the center lower part of the glass panel 40, but low temperature section III occupies a small portion at the lower part of the glass panel 40.

As shown in FIG. 10B, the temperature along the line FH3 was generally the highest, with the maximum temperature ($T_{max}$) measuring 58.5° C. on FH3, while the minimum temperature ($T_{min}$) measured 44.5° C. on FH5. Thus, the temperature difference ($\Delta T$) came to 14° C. Accordingly, the heat dissipation efficiency is not much better than comparative example 2, and worse than the present invention.

As described above, in the plasma display device according to the embodiments of the present invention, the adhesion rate of the thermally conductive medium can be improved without increasing the pressure applied to elements adhered thereto, so that the formation of an unnecessary air gap between a PDP and a chassis base can be minimized, while the manufacturing defects of the PDP or the chassis base are effectively overcome by employing a gel-like adhesive thermally conductive material as a thermally conductive medium between the PDP and the chassis base. Accordingly, the heat generated at the PDP can be conducted favorably through the thermally conductive medium, so that the reliability of the end product can be enhanced by the improvement of the overall thermal conduction efficiency.

Furthermore, the thermally conductive medium has adhesiveness after being cured, and thus the PDP and the chassis base can maintain their state of adhesion without the use of any additional means for adhesion.

Since an additional member such as a cooling fan is not required for dissipating the heat generated at the PDP, the problems of noise that may be generated by the cooling fan is avoided.

While the present invention has been described in detail with reference to the certain embodiments, those skilled in the art will appreciate that various modifications and substitutions can be made thereto without departing from the spirit and scope of the present invention as set forth in the appended claims.

What is claimed is:

1. A plasma display device comprising:

a plasma display panel;

a chassis base disposed substantially parallel to the plasma display panel; and a thermally conductive medium being disposed between the plasma display panel and the chassis base and being closely adhered to both the plasma display panel and the chassis base, wherein the thermally conductive medium is formed out of gel-like adhesive materials.

2. The plasma display device of claim 1, wherein the gel-like adhesive materials forming the thermally conductive medium include a mixture of silicone and a hardener.

3. The plasma display device of claim 1, wherein the thermally conductive medium includes a plurality of protrusions and a plurality of recesses formed on at least one side face opposing a contacting surface of the plasma display panel or the chassis base, one of the recesses being formed between each pair of adjacent protrusions and the recesses providing paths for the exhaust of air to the outside of the plasma display device when the thermally conductive medium is brought into contact with the contacting surface of the plasma display panel or the chassis base.

4. The plasma display device of claim 3, wherein the protrusions are formed parallel to a side of the chassis base in a striped pattern.

* * * * *